(12) United States Patent
Liu et al.

(10) Patent No.: US 12,433,053 B2
(45) Date of Patent: Sep. 30, 2025

(54) SENSING DEVICE AND ELECTRONIC DEVICE

(71) Applicant: InnoLux Corporation, Miao-Li County (TW)

(72) Inventors: Yu-Tsung Liu, Miao-Li County (TW); Te-Yu Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 18/676,702

(22) Filed: May 29, 2024

(65) Prior Publication Data
US 2024/0313027 A1    Sep. 19, 2024

Related U.S. Application Data

(63) Continuation of application No. 17/740,545, filed on May 10, 2022, now abandoned.

(30) Foreign Application Priority Data

Jun. 11, 2021    (CN) .......................... 202110656858.3

(51) Int. Cl.
*H10F 39/00* (2025.01)
*G06F 3/041* (2006.01)
(Continued)

(52) U.S. Cl.
CPC ....... *H10F 39/809* (2025.01); *G06F 3/04164* (2019.05); *G06F 3/0421* (2013.01);
(Continued)

(58) Field of Classification Search
None
See application file for complete search history.

(56) References Cited

U.S. PATENT DOCUMENTS 8,642,943 B2    2/2014   Mori
2020/0105638 A1*  4/2020  Chiang ................. H01L 21/561
(Continued)

FOREIGN PATENT DOCUMENTS

EP           3792975 A1 *  3/2021   ......... G02F 1/13338

OTHER PUBLICATIONS

Communication dated Jan. 16, 2025, issued in application No. EP 22175065.6.

*Primary Examiner* — Lunyi Lao
*Assistant Examiner* — Sarvesh J Nadkarni
(74) *Attorney, Agent, or Firm* — McClure, Qualey & Rodack, LLP

(57) ABSTRACT

A sensing device is provided. The sensing device includes a driving substrate, a sensing module, and a plurality of bonding pads. The driving substrate includes a first substrate and a plurality of driving circuits disposed on the first substrate. Each of the driving circuits includes a plurality of thin-film transistors. The sensing module is bonded to the driving substrate, and the sensing module includes a second substrate and a plurality of sensing elements disposed on the second substrate. The sensing module is bonded to the driving substrate through the bonding pads. In addition, each of the driving circuits is electrically connected to at least one of the sensing elements. The wavelength of light penetrating the first substrate is greater than or equal to 4 μm and less than or equal to 10 μm. An electronic device including the sensing device is also provided.

14 Claims, 8 Drawing Sheets

(51) Int. Cl.
    *G06F 3/042*         (2006.01)
    *G06V 40/13*        (2022.01)
    *H10F 39/12*        (2025.01)

(52) U.S. Cl.
    CPC ....... *G06V 40/1318* (2022.01); *H10F 39/198* (2025.01); *H10F 39/811* (2025.01)

(56) References Cited

U.S. PATENT DOCUMENTS

| | | | | |
|---|---|---|---|---|
| 2020/0364437 | A1* | 11/2020 | Wang | G06V 40/1318 |
| 2021/0151524 | A1* | 5/2021 | Tang | H10K 59/65 |
| 2021/0319197 | A1* | 10/2021 | Chang | G09G 3/3233 |
| 2022/0037406 | A1* | 2/2022 | Kubota | G06V 10/147 |
| 2022/0199576 | A1* | 6/2022 | Min | H01L 27/14627 |
| 2024/0243153 | A1* | 7/2024 | Choi | H10F 39/811 |

\* cited by examiner

SENSING DEVICE AND ELECTRONIC DEVICE

CROSS REFERENCE TO RELATED APPLICATIONS

This application is a Continuation of pending U.S. patent application Ser. No. 17/740,545, filed May 10, 2022 (now abandoned), which claims the benefit of China Application No. 202110656858.3, filed Jun. 11, 2021, the entirety of which are incorporated by reference herein.

BACKGROUND

Technical Field

The present disclosure is related to an electronic device, and in particular it is related to an electronic device with a sensing function.

Description of the Related Art

Optical sensing devices are widely used in consumer electronics such as smartphones and wearable devices etc., and have become indispensable necessities in modern society. With the flourishing development of such consumer electronics, consumers have high expectations regarding the quality, functionality, or price of these products.

The sensing element in the optical sensing device can convert received light into an electrical signal, and the electrical signal that is generated can be transmitted to the driving element and logic circuit in the optical sensing device for processing and analysis. However, the size of the sensor chip will increase as the resolution of the device is improved, and the manufacturing cost will also increase significantly, which makes the related applications difficult to become widely used.

Therefore, the development of a structural design that can further reduce the manufacturing cost of the optical sensing device and maintain the sensing sensitivity is still currently an important research topic in the industry.

SUMMARY

In accordance with some embodiments of the present disclosure, a sensing device is provided. The sensing device includes a driving substrate, a sensing module, a plurality of bonding pads, a plurality of first electrodes, and a plurality of second electrodes. The driving substrate includes a first substrate and a plurality of driving circuits disposed on the first substrate. Each of the plurality of driving circuits includes a plurality of thin-film transistors. The a material of the first substrate includes glass or polyimide. The sensing module is bonded to the driving substrate. The sensing module includes a second substrate and a plurality of sensing elements disposed on the second substrate. The sensing module is bonded to the driving substrate through the plurality of bonding pads. The second substrate is an epitaxial substrate. The plurality of first electrodes are disposed on the driving substrate. The plurality of second electrodes are disposed on the sensing module. The plurality of bonding pads are disposed between the plurality of first electrodes and the plurality of second electrodes. Each of the plurality of driving circuits is electrically connected to at least one of the plurality of sensing elements. The bonding pad has a first width. The first electrode has a second width. The second electrode has a third width. The first width is greater than or equal to the second width. The first width is greater than or equal to the third width. The pitch between the plurality of sensing elements is greater than or equal to 15 µm and less than or equal to 20 µm. In addition, the wavelength of light penetrating the first substrate is greater than or equal to 4 µm and less than or equal to 10 µm.

In accordance with some embodiments of the present disclosure, an electronic device is provided. The electronic device includes a display panel and a sensing device. The display panel has a display side, and the sensing device is attached to a side of the display panel opposite to the display side. The sensing device includes a driving substrate, a sensing module and a plurality of bonding pads. The driving substrate includes a first substrate and a plurality of driving circuits disposed on the first substrate. Each of the plurality of driving circuits includes a plurality of thin-film transistors. The material of the first substrate includes glass or polyimide. The sensing module is bonded to the driving substrate. The sensing module includes a second substrate and a plurality of sensing elements disposed on the second substrate. The second substrate is an epitaxial substrate. The sensing module is bonded to the driving substrate through the plurality of bonding pads. Each of the plurality of driving circuits is electrically connected to at least one of the plurality of sensing elements. The plurality of sensing elements are closer to the display panel than the plurality of driving circuits. The display panel includes a display layer and a light source. The display layer and the light source do not overlap in a normal direction of the display layer. In addition, the wavelength of light penetrating the first substrate is greater than or equal to 4 µm and less than or equal to 10 µm.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
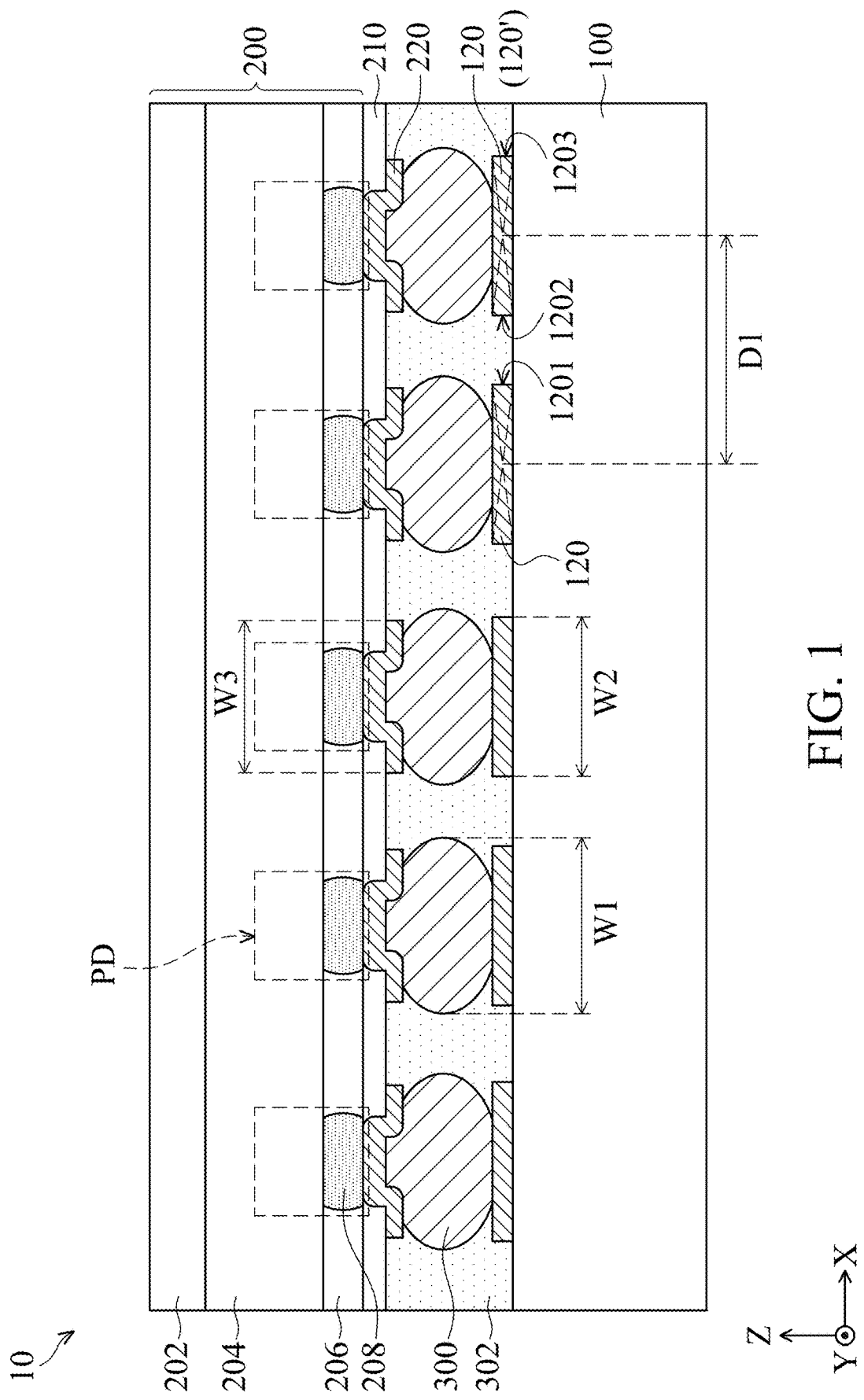
FIG. 1 is a cross-sectional diagram of a sensing device in accordance with some embodiments of the present disclosure.

The sensing device and the electronic device according to the present disclosure are described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. These embodiments are used merely for the purpose of illustration, and the present disclosure is not limited thereto. In addition, different embodiments may use like and/or corresponding numerals to denote like and/or corresponding elements in order to clearly describe the present disclosure. However, the use of like and/or corresponding numerals of different embodiments does not suggest any correlation between different embodiments.

It should be understood that relative expressions may be used in the embodiments. For example, "lower", "bottom", "higher" or "top" are used to describe the position of one element relative to another. It should be appreciated that if a device is flipped upside down, an element that is "lower" will become an element that is "higher". The present disclosure can be understood by referring to the following detailed description in connection with the accompanying drawings. The drawings are also regarded as part of the description of the present disclosure. It should be understood that the drawings of the present disclosure may be not drawn to scale. In fact, the size of the elements may be arbitrarily enlarged or reduced to clearly represent the features of the present disclosure.

Furthermore, the expression "a first element/layer is disposed on a second element/layer" or "a first element/layer is connected to a second element/layer", may indicate that the first element/layer is in direct contact with the second element/layer, or it may indicate that the first element/layer is in indirect contact with the second element/layer. In the situation where the first element/layer is in indirect contact with the second element/layer, there may be one or more intermediate layers between the first element/layer and the second element/layer. However, the expression "the first element/layer is directly disposed on the second element/layer" or "the first element/layer is directly connected to the second element/layer" means that the first element/layer is in direct contact with the second element/layer, and there is no intermediate element or layer between the first element/layer and the second element/layer.

Moreover, it should be understood that the ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is to make an element with a certain name can be clearly distinguished from another element with the same name. Claims and the specification may not use the same terms. Accordingly, the first element in the specification may refer to the second element in the claims.

In accordance with the embodiments of the present disclosure, regarding the terms such as "connected to", "coupled to", etc. referring to bonding and connection, unless specifically defined, these terms mean that two structures are in direct contact or two structures are not in direct contact, and other structures are provided to be disposed between the two structures. The terms for bonding and connecting may also include the case where both structures are movable or both structures are fixed. In addition, the term "electrically connected to" or "electrically coupled to" may include any direct or indirect electrical connection means.

In the following descriptions, terms "about" and "substantially" typically mean +/−10% of the stated value, or typically +/−5% of the stated value, or typically +/−3% of the stated value, or typically +/−2% of the stated value, or typically +/−1% of the stated value or typically +/−0.5% of the stated value. The stated value of the present disclosure is an approximate value. When there is no specific description, the stated value includes the meaning of "about" or "substantially". The expression "in a range from the first value to the second value" or "between the first value and the second value" means that the range includes the first value, the second value, and other values in between.

The electronic device of the present disclosure may include a display device, an antenna device, a sensing device, a touch display, a curved display, or a free shape display, but it is not limited thereto. The electronic device may be a bendable or flexible electronic device. The electronic device may include, for example, light-emitting diodes, liquid crystals, fluorescence, phosphors, quantum dots (QDs), other suitable display media, or a combination thereof, but it is not limited thereto. The light-emitting diode may include, for example, an organic light-emitting diode (OLED), an inorganic light-emitting diode (LED), a mini light-emitting diode (mini LED), a micro light-emitting diode (micro LED) or a quantum dot light-emitting diode (such as QLED, QDLED), or other suitable materials or any combination of the above, but it is not limited thereto. The display device may include, for example, a tiled display device, but it is not limited thereto. The antenna device may be, for example, a liquid-crystal antenna, but it is not limited thereto. The antenna device may include, for example, an antenna tiled device, but it is not limited thereto. It should be noted that, the electronic device can be any arrangement and combination of the foregoing, but it is not limited thereto. In addition, the shape of the electronic device may be rectangular, circular, polygonal, a shape with curved edges, or other suitable shapes. The electronic device may have peripheral systems such as a driving system, a control system, a light source system, a shelf system, etc. to support a display device, an antenna device or a tiled device. In the following description, a display device will be used as an example to describe the electronic device, but the present disclosure is not limited thereto.

It should be understood that in the following embodiments, without departing from the spirit of the present disclosure, the features in several different embodiments can be replaced, recombined, and mixed to complete another embodiment. The features between the various embodiments can be mixed and matched arbitrarily as long as they do not violate or conflict the spirit of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

Refer to FIG. 1, which is a cross-sectional diagram of a sensing device 10 in accordance with some embodiments of the present disclosure. It should be understood that, for clear description, some elements of the sensing device 10 are omitted in the figures, and only some elements are schematically shown. In accordance with some embodiments, additional features may be added to the sensing device 10 described below. In accordance with some other embodiments, some features of the sensing device 10 described below may be replaced or omitted. In accordance with some other embodiments, the sensing device 10 described below can sense optical signals or thermal signals, but it is not limited thereto. The embodiments of the present disclosure will be described with the sensing device 10 capable of sensing optical signals.

As shown in FIG. 1, the sensing device 10 includes a driving substrate 100, a sensing module 200, and a plurality of bonding pads 300. The sensing module 200 can be bonded to the driving substrate 100 through the bonding pads 300 and electrically connected to the driving substrate 100. The sensing module 200 can receive light and convert it into electrical signals, and the generated electrical signals can be transmitted to the driving substrate 100 for subsequent processing and analysis. First, the sensing module 200 will be described. The detailed structure of the driving substrate 100 will be described in FIG. 2, and the bonding pads 300 will also be described in the following paragraphs.

In accordance with some embodiments, the sensing module 200 includes a second substrate 202 and a plurality of sensing elements PD disposed on the second substrate 202. The sensing element PD can be a photodiode, which can convert optical signals into electrical signals. Specifically, in accordance with some embodiments, the sensing module 200 includes a first layer 204, a second layer 206 and a plurality of doping regions 208 disposed on the second substrate 202, and the doping regions 208 are disposed in the second layer 206. In accordance with some embodiments, the sensing element PD includes portions of the first layer 204, the second layer 206 and the doped region 208.

In accordance with some embodiments, the second substrate 202, the first layer 204, the second layer 206, and the doped regions 208 may be formed of semiconductor materials. The sensing element PD may include a semiconductor material, and the semiconductor material may include indium phosphide (InP), indium antimonide (InSb), indium gallium arsenide (InGaAs), lead sulfide (PbS), lead selenide (PbSe), mercury cadmium telluride (HgCdTe), another suitable semiconductor material, or a combination thereof, but it is not limited thereto. In accordance with some embodiments, the second substrate 202 may be an epitaxial substrate.

In accordance with some embodiments, the aforementioned semiconductor material may include a group III or group V element and therefore have P-type or N-type conductivity. For example, in accordance with some embodiments, the second substrate 202, the first layer 204 and the second layer 206 may have the same conductivity type, and the doped region 208 may have the conductivity type that is different from them, thereby forming a PN junction of the sensing element PD. For example, in accordance with some embodiments, the second substrate 202, the first layer 204 and the second layer 206 have P-type conductivity, and the doped region 208 has N-type conductivity. In accordance with some other embodiments, the second substrate 202, the first layer 204 and the second layer 206 have N-type conductivity, and the doped region 208 has P-type conductivity. More specifically, in accordance with some embodiments, the second substrate 202 may be N-type InP, the first layer 204 may be N-type InGaAs, the second layer 206 may be N-type InP, and group III elements may be implanted in the second layer 206 to form the P-type doped region 208, but it is not limited thereto.

In accordance with some embodiments, a metal organic chemical vapor deposition (MOCVD) process, a molecular beam epitaxy (MBE) process, a hydride vapor phase epitaxy (HVPE) process, a liquid phase epitaxy (LPE) process, or another suitable process may be used to form the aforementioned second substrate 202, first layer 204 and second layer 206, but the present disclosure is not limited thereto. Furthermore, in accordance with some embodiments, the aforementioned doped regions 208 may be formed by an ion implantation process, a diffusion process, or another suitable process, but the present disclosure is not limited thereto.

In accordance with some embodiments, the sensing element PD is used to absorb light of a specific wavelength range. In accordance with the embodiments of the present disclosure, the light of the specific wavelength range can be, for example, visible light or invisible light. The visible light can be, for example, laser light, and the invisible light can be, for example, infrared (IR) light, but they are not limited thereto. Specifically, in accordance with some embodiments, the wavelength range of the aforementioned infrared light is greater than or equal to about 750 nanometers (nm) and less than or equal to about 1500 nanometers (i.e. 750 nm≤wavelength≤1500 nm). It should be noted that the sensing element PD that absorbs light in a specific wavelength range can reduce the noise generated by ambient light absorption of the sensing element PD, thereby improving the sensitivity of the sensing module 200.

As shown in FIG. 1, in accordance with some embodiments, the sensing device 10 includes a plurality of bonding pads 300, and the sensing module 200 is bonded to the driving substrate 100 through the bonding pads 300 and is electrically connected to a driving circuit 100C (which will be described in FIG. 3) disposed on the driving substrate 100. Specifically, in accordance with some embodiments, the sensing device 10 includes a plurality of first electrodes 120 and a plurality of second electrodes 220, the first electrodes 120 are disposed on the driving substrate 100, and the second electrodes 220 are disposed on the sensing module 200. The bonding pad 300 is disposed between the first electrode 120 and the second electrode 220, and the bonding pad 300 is bonded to the first electrode 120 and the second electrode 220 so that the first electrode 120 can be electrically connected to the second electrode 220. That is, the sensing module 200 includes a plurality of sensing elements PD disposed on the second substrate 202; after the sensing elements PD convert optical signals into electrical signals, the sensing elements PD can transmit electrical signals to the driving substrate 100 through the bonding pads 300, the first electrodes 120, and the second electrodes 220.

As shown in FIG. 1, in accordance with some embodiments, in a first direction, the bonding pad 300 has a first width W1, the first electrode 120 has a second width W2, and the second electrode 220 has a third width W3. The first width W1, the second width W2 and the third width W3 may be, for example, the maximum widths of the bonding pad 300, the first electrode 120 and the second electrode 220 respectively, but they are not limited thereto. Specifically, the first width W1 may be greater than or equal to the second width W2, the first width W1 may be greater than or equal to the third width, and the second width W2 may be approximately equal to the third width W3, but they are not limited thereto. With the above arrangement, the bonding between the sensing module 200 and the driving substrate 100 can be improved, and the electrical connection can be further improved. In addition, the first direction (e.g., X direction shown in the figure) and the second direction (e.g., Y direction shown in the figure) are perpendicular to the third direction (e.g., Z direction shown in the figure), and the third direction may be, for example, a normal direction of the substrate (e.g., the first substrate 102 or the second substrate 202).

Furthermore, in accordance with some embodiments, a pitch D1 between the sensing elements PD may be greater than or equal to about 10 μm and less than or equal to about 30 μm (i.e. 10 μm≤pitch D1≤30 μm), or greater than or equal to about 15 μm and less than or equal to about 20 μm. Specifically, the pitch D1 between the sensing elements PD refers to the pitch between two adjacent first electrodes 120 that are electrically connected to two adjacent sensing elements PD, respectively. For example, the pitch D1 refers to the distance between the first electrode 120 and another adjacent first electrode 120', or the pitch D1 refers to the distance between the first electrode 120 and the closest another first electrode 120', and the aforementioned distance refers to the distance between a center point of the first electrode 120 and a center point of another adjacent first electrode 120'. Specifically, for example, in a cross-sectional diagram, the center point of the first electrode 120 is the intersection point of two diagonal lines of the first electrode 120, and the center point of another first electrode 120' is the intersection point of two diagonal lines of another first electrode 120'. Alternatively, in accordance with some embodiments, the aforementioned distance between the first electrode 120 and another adjacent first electrode 120' refers to the distance between a side of the first electrode 120 and a side of another adjacent first electrode 120'. Specifically, the first electrode 120 has a first side 1201, and another first electrode 120' has a second side 1202 and a third side 1203, and the third side 1203 is farther from the first side 1201 than the second side 1202 along the X direction. That is, the aforementioned distance (pitch) can be the distance between the first side 1201 of the first electrode 120 and the third side 1203 of another adjacent first electrode 120'. An appropriate measurement method can be selected according to product conditions to obtain the pitch between the sensing elements PD, and the present disclosure is not limited thereto.

In accordance with some embodiments (not illustrated), the first electrodes 120 or the second electrodes 220 may be omitted, and the pitch D1 between the sensing elements PD refers to the distance between two adjacent bonding pads 300 that are electrically connected to two adjacent sensing elements PD respectively. Specifically, the pitch D1 refers to the distance between the bonding pad 300 and another adjacent first bonding pad 300', and the distance between the bonding pad 300 and another adjacent bonding pad 300' may be the distance between a side of the bonding pad 300 and a side of another adjacent first bonding pad 300', but it is not limited thereto. An appropriate measurement method can be selected according to product conditions to needs to obtain the pitch D1. With the aforementioned arrangement of the pitch D1, the problem of sensitivity affected by insufficient numbers of sensing elements PD, or the cost increase caused by excessive numbers of sensing elements PD can be decreased.

In addition, it should be understood that, in accordance with the embodiments of the present disclosure, an optical microscope (OM), a scanning electron microscope (SEM), a film thickness profiler (α-step), an ellipsometer or another suitable method may be used to measure the pitch or distance between elements, or the width, thickness, height or area of each element. Specifically, in some embodiments, a scanning electron microscope may be used to obtain a cross-sectional image including the elements to be measured, and the pitch or distance between elements, or the width, thickness, height or area of each element in the image can be measured.

Moreover, in accordance with some embodiments, the sensing device 10 further includes a passivation layer 210 and a spacer material 302, and the passivation layer 210 and the spacer material 302 are disposed between the sensing module 200 and the driving substrate 100. In accordance with some embodiments, the passivation layer 210 is disposed on the second layer 206, and the passivation layer 210 has a through-hole, and a portion of the second electrode 220 is disposed in the through-hole to electrically connect the doped region 208 with the bonding pad 300. In accordance with some embodiments, the spacer material 302 is filled between the bonding pads 300, which can reduce the influence of moisture or oxygen in the environment on the first electrodes 120, the second electrodes 220, the bonding pads 300 or the driving substrate 100, and reduce the risk of corrosion or oxidation of these elements.

The first electrodes 120 and the second electrodes 220 may include conductive materials, such as metal conductive materials, transparent conductive materials, other suitable conductive materials, or a combination thereof, but they are not limited thereto. In accordance with some embodiments, the metal conductive material may include nickel (Ni), copper (Cu), silver (Ag), gold (Au), tin (Sn), aluminum (Al), molybdenum (Mo), tungsten (W), chromium (Cr), platinum (Pt), titanium (Ti), alloys of the foregoing metals, another suitable material, or a combination thereof, but it is not limited thereto. In accordance with some embodiments, the transparent conductive material may include transparent conductive oxide (TCO). For example, transparent conductive oxide may include indium tin oxide (ITO), antimony zinc oxide (AZO), tin oxide (SnO), zinc oxide (ZnO), indium zinc oxide (indium zinc oxide, IZO), indium gallium zinc oxide (IGZO), indium tin zinc oxide (ITZO), antimony tin oxide (ATO), another suitable transparent conductive material, or a combination thereof, but it is not limited thereto.

In accordance with some embodiments, the bonding pads 300 may include tin (Sn), aluminum (Al), a tin alloy, an aluminum alloy, another suitable solder material, or a combination thereof, but it is not limited thereto.

In accordance with some embodiments, the passivation layer 210 may have a single layer or multiple layers, and the material of the passivation layer 210 may include an inorganic material, an organic material, or a combination thereof, but it is not limited thereto. For example, the inorganic material may include silicon nitride, silicon oxide, silicon oxynitride, another suitable material, or a combination thereof, but it is not limited thereto. For example, the organic material may include polyethylene terephthalate (PET), polyethylene (PE), polyethersulfone (PES), polycarbonate (PC), polymethylmethacrylate (PMMA), polyimide (PI), another suitable material, or a combination thereof, but it is not limited thereto.

In accordance with some embodiments, the spacer material 302 may include an organic material, an inorganic material, another suitable protective material, or a combination thereof, but it is not limited thereto. For example, the inorganic material may include silicon nitride, silicon oxide, silicon oxynitride, aluminum oxide, or another suitable material, but it is not limited thereto. For example, the organic material may include epoxy resins, silicone resins, acrylic resins (e.g., polymethylmethacrylate (PMMA)), benzocyclobutene (BCB), polyimide, polyesters, polydimethylsiloxane (PDMS), perfluoroalkoxy alkane (PFA), another suitable material, or a combination thereof, but it is not limited thereto.

In accordance with some embodiments, the passivation layer 210 is formed on the second layer 206 first, and portions of the passivation layer 210 are removed by a patterning process to form through-holes, and then the second electrodes 220 are formed on the passivation layer 210 and fill in the through-holes. Moreover, after the first electrodes 120 are formed on the driving substrate 100, the driving substrate 100 and the sensing module 200 can be assembled together. In accordance with some embodiments, the second electrode 220 and the first electrode 120 may be bonded through the bonding pad 300 by using a eutectic bonding process. In accordance with some embodiments, the spacer material 302 is formed between the driving substrate 100 and the sensing module 200 after the eutectic bonding process is performed.

In accordance with some embodiments, the passivation layer 210 may be formed by a coating process, a chemical vapor deposition process, a physical vapor deposition process, a printing process, another suitable process, or a combination thereof. The chemical vapor deposition process may include, for example, a low pressure chemical vapor deposition (LPCVD) process, a low temperature chemical vapor deposition (LTCVD) process, a rapid thermal chemical vapor deposition (RTCVD) process, a plasma enhanced chemical vapor deposition (PECVD) process, an atomic layer deposition (ALD) process, but it is not limited thereto. The physical vapor deposition process may include, for example, a sputtering process, an evaporation process, a pulsed laser deposition process, but it is not limited thereto.

Furthermore, the patterning process may include a photolithography process and/or an etching process. In accordance with some embodiments, the photolithography process may include photoresist coating (e.g., spin coating), soft baking, hard baking, mask alignment, exposure, post-exposure baking, photoresist development, washing and drying, etc., but it is not limited thereto. The etching process may include a dry etching process or a wet etching process, but it is not limited thereto.

In accordance with some embodiments, the first electrodes 120 and the second electrodes 220 may be formed by a chemical vapor deposition process, a physical vapor deposition process, an electroplating process, an electroless plating process, another suitable process, or a combination thereof, but the present disclosure is not limited thereto.

In accordance with some embodiments, the temperature range of the aforementioned eutectic bonding process may be less than 260° C., e.g., greater than or equal to about 25° C. and less than or equal to about 200° C., or greater than or equal to about 160° C. and less than or equal to about 260° C., and the eutectic bonding process may be performed for about 3 minutes to about 6 minutes, but the present disclosure is not limited thereto.

In addition, in accordance with some embodiments, the spacer material 302 may be formed by a coating process, a chemical vapor deposition process, a physical vapor deposition process, a printing process, another suitable process, or a combination thereof.

Figure 2:
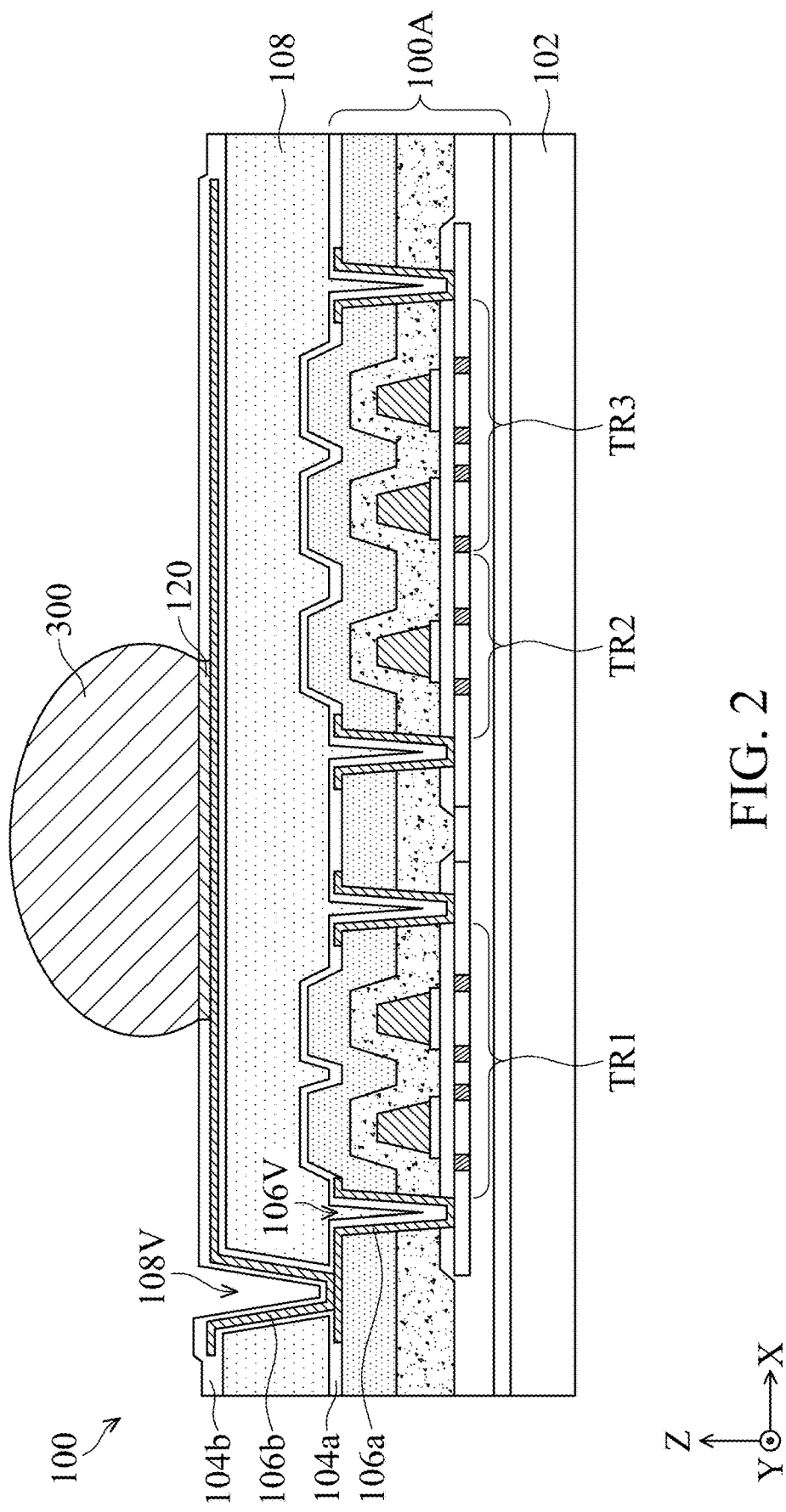
FIG. 2 is a partial cross-sectional diagram of a sensing device in accordance with some embodiments of the present disclosure.
Figure 3:
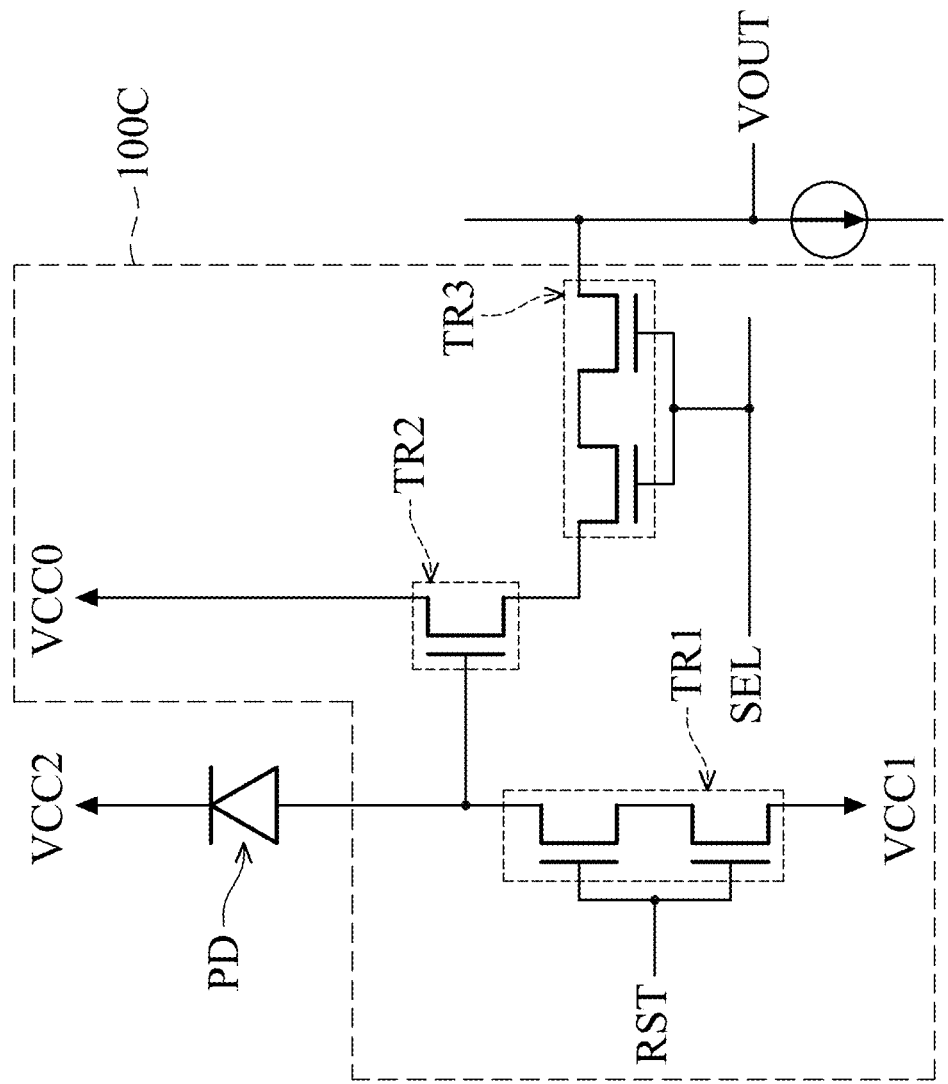
FIG. 3 is an equivalent circuit diagram of a sensing device in accordance with some embodiments of the present disclosure.

Next, refer to FIG. 2 and FIG. 3. FIG. 2 is a partial cross-sectional diagram of the sensing device 10 in accordance with some embodiments of the present disclosure. FIG. 3 is an equivalent circuit diagram of the sensing device 10 in accordance with some embodiments of the present disclosure. Specifically, FIG. 2 shows the detailed structure of the driving substrate 100, and FIG. 3 shows the circuit connection relationship between the sensing element PD and the driving circuit 100C in the sensing device 10.

In accordance with some embodiments of the present disclosure, the sensing device 10 is provided, and the driving substrate 100 of the sensing device 10 is, for example, an active matrix driving substrate including thin-film transistors (TFTs), but it is not limited thereto. Through the substrate design in the embodiments of the present disclosure, the manufacturing cost can be reduced, and the related application of the sensing device can be increased. In accordance with some embodiments of the present disclosure, the sensing device detects light of a specific wavelength range and combined with the structural design of the substrate to reduce the influence of noise on the sensing module, thereby improving the signal-to-noise ratio (SNR) or enhancing the overall performance of the sensing device, but the present disclosure is not limited thereto. The structure of the driving substrate 100 is described as follows.

As shown in FIG. 2 and FIG. 3, the driving substrate 100 includes a first substrate 102 and a plurality of driving circuits 100C disposed on the first substrate 102, and each of the driving circuits 100C includes a plurality of thin-film transistors. Specifically, the driving circuits 100C each may include a plurality of first thin-film transistors (for example, a first thin-film transistor TR1, a first thin-film transistor TR2 and a first thin-film transistor TR3 shown in the figures), and the driving circuits 100C each may be electrically connected to at least one of the sensing elements PD. That is, the driving circuits 100C may be electrically connected to the sensing elements PD, respectively, but it is not limited thereto.

The first substrate 102 may include a flexible substrate, a rigid substrate, or a combination thereof, but it is not limited thereto. In accordance with some embodiments, the material of the first substrate 102 may include glass, quartz, sapphire, ceramic, polyimide (PI), polycarbonate (PC), polyethylene terephthalate (PET), polypropylene (PP), another suitable material, or a combination thereof, but it is not limited thereto. Moreover, in accordance with some embodiments, the first substrate 102 may include a metal-glass fiber composite plate, or a metal-ceramic composite plate, but it is not limited thereto.

It should be noted that the wavelength range of the light that can penetrate the first substrate 102 formed of the aforementioned specific materials can be greater than or equal to about 4 µm and less than or equal to about 10 µm. Therefore, in accordance with the embodiments of the present disclosure, the noise generated by the absorption of external light or other reflected light through the first substrate 102 and absorbed by the sensing elements PD can be reduced, thereby improving the signal-to-noise ratio (SNR) of the sensing device 10. In addition, in accordance with some embodiments, with the selection of the material of the first substrate 102 in combination with the aforementioned sensing elements PD that absorbs light of a specific wavelength range, the performance of the signal-to-noise ratio can be further improved, and the overall performance of the sensing device 10 can be improved.

Furthermore, in accordance with some embodiments, the driving substrate 100 includes a structure layer 100A, and the structure layer 100A may include conductive elements and signal lines that are electrically connected to the first thin-film transistors, and insulation layers formed between the conductive elements, and planarization layers, etc. In accordance with some embodiments, the signal line may include, for example, a current signal line, a voltage signal line, a high-frequency signal line, and a low-frequency signal line, and the signal line can transmit device operating voltage (VDD), common ground voltage (VSS), or the voltage of driving device terminal, but the present disclosure is not limited thereto.

In accordance with some embodiments, the first thin-film transistor may include a switching transistor, a driving transistor, a reset transistor, a transistor amplifier, or another suitable thin-film transistor. Specifically, as shown in FIG. 2, is accordance with some embodiments, the first thin-film transistor TR1 is a reset transistor, and the first thin-film transistor TR2 is a transistor amplifier or a source follower, and the first thin-film transistor TR3 is a switching transistor, but they are not limited thereto.

It should be understood that the number of the first thin-film transistors is not limited to that shown in the figures. According to different embodiments, the driving substrate 100 may have other suitable numbers or types of the first thin-film transistors. Moreover, the type of the first thin-film transistor may include a top gate thin-film transistor, a bottom gate thin-film transistor, a dual gate (or double gate) thin-film transistor, or a combination thereof. In accordance with some embodiments, the first thin-film transistors may be further electrically connected with a capacitor element, but it is not limited thereto. Furthermore, the first thin-film transistor may include at least one semiconductor layer, a gate dielectric layer, and a gate electrode layer. The first thin-film transistors may exist in various forms known to those skilled in the art, and the detailed structure of the first thin-film transistors will not be repeated here.

In addition, as shown in FIG. 2, in accordance with some embodiments, the driving substrate 100 of the sensing device 10 includes the planarization layer 108, and the planarization layer 108 is disposed on the structural layer 100A and between the structural layer 100A and the first electrode 120. The first electrode 120 is disposed on the planarization layer 108, and is electrically connected to a conductive layer 106a in the structure layer 100A through a conductive layer 106b, and thereby electrically connected to the first thin-film transistor TR1, the first thin-film transistor TR2 and the first thin-film transistor TR3.

In accordance with some embodiments, the conductive layer 106b is electrically connected to the conductive layer 106a through the planarization layer 108, and the conductive layer 106a may pass through, for example, a gate dielectric layer (not illustrated) and a dielectric layer (not illustrated) and be electrically connected to the semiconductor layer of the first thin-film transistor TR1, but it is not limited thereto. Specifically, in accordance with some embodiments, a portion of the gate dielectric layer and the dielectric layer in the structure layer 100A may be removed by a patterning process to form a through-hole 106v, a passivation layer 104a may be formed on the dielectric layer and in the through-hole 106v, the conductive layer 106a may be formed on the passivation layer 104a, and then the passivation layer 104a and the planarization layer 108 may be formed on the conductive layer 106a. In accordance with some embodiments, a portion of the planarization layer 108 may be removed by a patterning process to form a through-hole 108v, then a passivation layer 104b may be formed on the planarization layer 108 and in the through-holes 108v, the conductive layer 106b may be formed on the passivation layer 104b, and then the passivation layer 104b may be formed on the conductive layer 106b. In accordance with some embodiments, after the passivation layer 104b is formed, a portion of the passivation layer 104b may then be removed to expose a portion of the conductive layer 106b, and the first electrode 120 may be formed on the exposed conductive layer 106b.

In accordance with some embodiments, the materials of the conductive layer 106a and the conductive layer 106b may include conductive materials, such as metallic conductive materials, transparent conductive materials, other suitable conductive materials, or a combination thereof, but they are not limited thereto. In accordance with some embodiments, the conductive layer 106a and the conductive layer 106b may be formed by a chemical vapor deposition process, a physical vapor deposition process, an electroplating process, an electroless plating process, another suitable process, or a combination thereof, but it is not limited thereto.

In accordance with some embodiments, the materials of the passivation layer 104a and the passivation layer 104b may be the same as or similar to the materials of the aforementioned passivation layer 204, and the method of forming the passivation layer 104a and the passivation layer 104b may be the same as or similar to the process of forming the aforementioned passivation layer 204, and thus will not be repeated here.

In accordance with some embodiments, the material of the planarization layer 108 may include an organic material, an inorganic material, another suitable material, or a combination thereof, but it is not limited thereto. For example, the inorganic material may include silicon nitride, silicon oxide, silicon oxynitride, aluminum oxide, another suitable material, or a combination thereof, but it is not limited thereto. For example, the organic material may include epoxy resins, silicone resins, acrylic resins (e.g., polymethylmethacrylate (PMMA)), polyimide, perfluoroalkoxy alkane (PFA), another suitable material, or a combination thereof, but it is not limited thereto.

In accordance with some embodiments, the planarization layer 108 may be formed by a chemical vapor deposition process, a physical vapor deposition process, a coating process, a printing process, another suitable process, or a combination thereof, but it is not limited thereto.

As mentioned above, in accordance with some embodiments, the first electrode 120 and the second electrode 220 are bonded through the bonding pad 300, so that the driving circuit 100C of the driving substrate 100 is electrically connected to the sensing module 200. Specifically, referring to FIG. 3, in accordance with some embodiments, the first thin-film transistor TR1 and the first thin-film transistor TR2 are electrically connected to one terminal of the sensing element PD, and the first thin-film transistor TR2 is further electrically connected to the first thin-film transistor TR3. In accordance with some embodiments, the first thin-film transistor TR1 can reset the electrical potential of the sensing element PD to give an initial electrical potential, and the photocurrent generated by the sensing element PD after sensing can change the electrical potential of the first thin-film transistor TR2, and the first thin-film transistor TR3 can convert the electrical potential change into a current change, and transmit the signal generated by the current change.

As described above, the driving circuit 100C includes the first thin-film transistor TR1, the first thin-film transistor TR2 and the first thin-film transistor TR3. In detail, for example, as shown in FIG. 3, the sensing element PD has a first terminal and a second terminal, the first terminal is coupled to the system voltage line VCC2, and the second terminal is coupled to the second terminal of the first thin-film transistor TR1 and the control terminal of the first thin-film transistor TR2.

The first thin-film transistor TR1 has a first terminal, a second terminal and a control terminal, the first terminal is coupled to the system voltage line VCC1, the second terminal is coupled to the sensing element PD, and the control terminal is coupled to the control signal RST. The first thin-film transistor TR1 can be connected to or disconnected from the system voltage line VCC1 according to the control signal RST. When the first thin-film transistor TR1 is connected to the system voltage line VCC1, the electrical potential of the sensing element PD can be reset; on the other hand, when the first thin-film transistor TR1 is disconnected from the system voltage line VCC1, the electrical potential of the sensing element PD is not reset.

Moreover, the first thin-film transistor TR2 also has a first terminal, a second terminal and a control terminal, the first terminal is coupled to the system voltage line VCC0, the second terminal is coupled to the first terminal of the first thin-film transistor TR3, and the control terminal is coupled to the second terminal of the first thin-film transistor TR1 and the second terminal of the sensing element PD.

Furthermore, the first thin-film transistor TR3 also has a first terminal, a second terminal and a control terminal, the first terminal is coupled to the second terminal of the first thin-film transistor TR2, the second terminal is coupled to the readout signal line VOUT, and the control terminal is coupled to the scan line signal SEL. The first thin-film transistor TR3 can be connected to or disconnect from the first terminal of the first thin-film transistor TR3 and the readout signal line VOUT according to the scan line signal SEL. When the first terminal of the first thin-film transistor TR3 is connected to the readout signal line VOUT, the current can be output to the readout signal line VOUT; on the other hand, when the first terminal of the first thin-film transistor TR3 is disconnected from the readout signal line VOUT, no current is output to the readout signal line VOUT.

Figure 4:
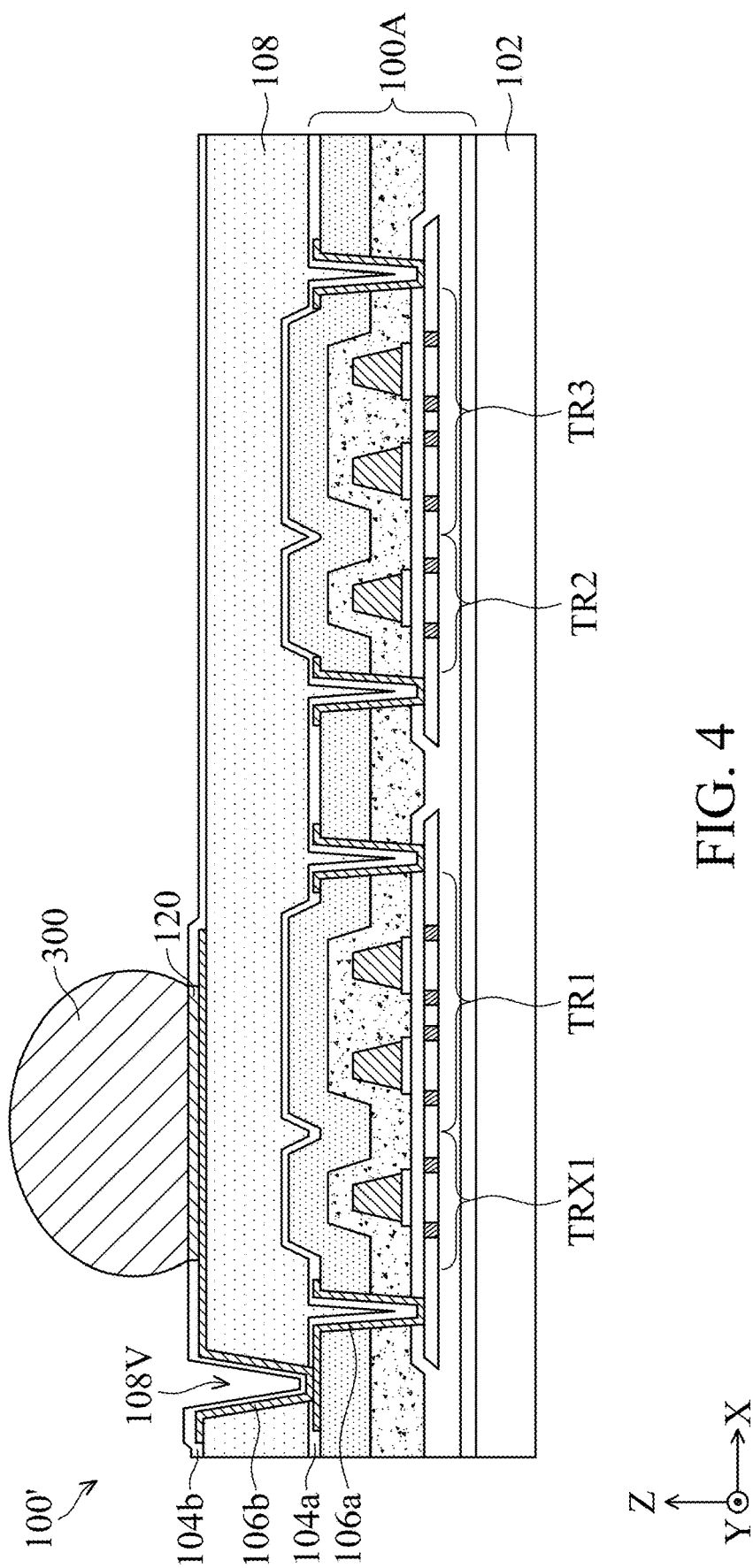
FIG. 4 is a partial cross-sectional diagram of a sensing device in accordance with some embodiments of the present disclosure.
Figure 5:
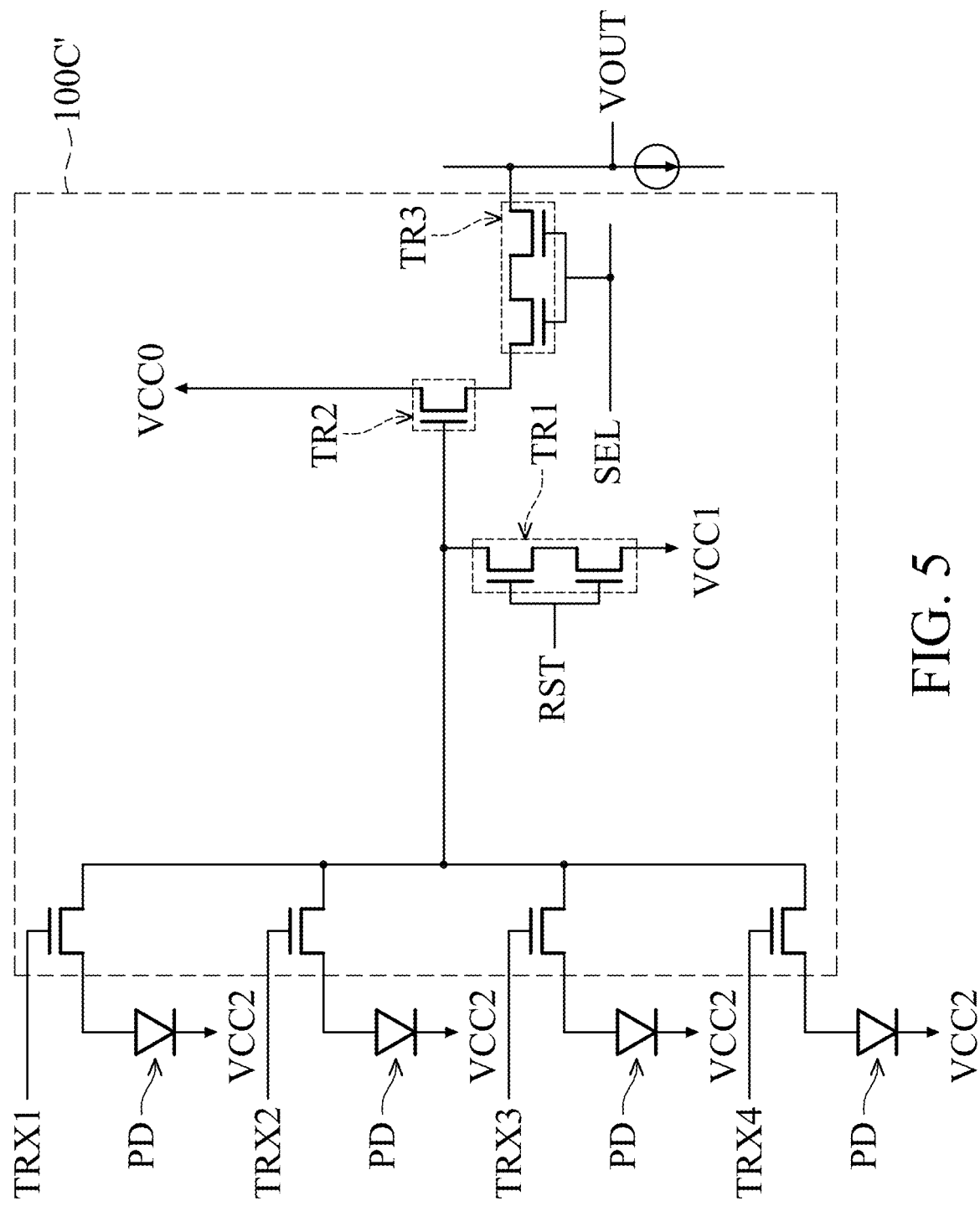
FIG. 5 is an equivalent circuit diagram of a sensing device in accordance with some embodiments of the present disclosure.

Next, refer to FIG. 4 and FIG. 5. FIG. 4 is a partial cross-sectional diagram of a sensing device in accordance with some other embodiments of the present disclosure. FIG. 5 is an equivalent circuit diagram corresponding to the sensing device of FIG. 4 in accordance with some other embodiments of the present disclosure. Specifically, FIG. 4 shows the detailed structure of the driving substrate 100', and FIG. 5 shows the circuit connection relationship between the sensing element PD in the sensing device and the driving circuit 100C'.

In addition, it should be understood that the same or similar components or elements in the following paragraph will be denoted by the same or similar reference numbers, and their materials, manufacturing methods and functions are the same or similar to those described above, and thus they will not be repeated in the following context.

As shown in FIG. 4 and FIG. 5, in accordance with some embodiments, in addition to the first thin-film transistor TR1, the first thin-film transistor TR2 and the first thin-film transistor TR3 described in the foregoing embodiments of FIG. 2 and FIG. 3, the driving substrate 100' further includes a plurality of second thin-film transistors (e.g., a second thin-film transistor TRX1, a second thin-film transistor TRX2, a second thin-film transistor TRX3, and a second thin-film transistor TRX4 shown in FIG. 4 and FIG. 5). In accordance with some embodiments, the first thin-film transistor TR1 (or the first thin-film transistor TR2, or the first thin-film transistor TR3) is electrically connected to the sensing element PD through the second thin-film transistor TRX1. Specifically, the second thin-film transistor TRX1 can be electrically connected to the conductive layer 106a, and further electrically connected to the first thin-film transistor TR1, the first thin-film transistor TR2, and the first thin-film transistor TR3. In accordance with some embodiments, the conductive layer 106b is electrically connected to the conductive layer 106a through the planarization layer 108, and the conductive layer 106a can penetrate through, for example, a gate dielectric layer (not illustrated) and a dielectric layer (not illustrated) and be electrically connected the semiconductor layer of the second thin-film transistor TRX1, but it is not limited thereto.

In addition, in accordance with some embodiments, the first thin-film transistor TR1 (or the first thin-film transistor TR2, or the first thin-film transistor TR3) can also be electrically connected to other sensing elements PD through the second thin-film transistor TRX2, the second thin-film transistor TRX3 and the second thin-film transistor TRX4, respectively.

In accordance with some embodiments, the second thin-film transistor TRX1, the second thin-film transistor TRX2, the second thin-film transistor TRX3, and the second thin-film transistor TRX4 may be transfer transistors, and the second thin-film transistors can be connected in parallel with one another, but it is not limited thereto.

It should be noted that, in accordance with the embodiment shown in FIG. 4 and FIG. 5, with the configuration of the second thin-film transistor TRX1, the second thin-film transistor TRX2, the second thin-film transistor TRX3 and the second thin-film transistor TRX4 (for example, the four sensing elements PD are respectively coupled to different pixels, and the four sensing elements PD can share a set of first thin-film transistors (i.e. the first thin-film transistor TR1, the first thin-film transistor TR2, and the first thin-film transistor TR3)), the number of thin-film transistors per pixel can be reduced, the pixel pitch can be reduced, and the resolution of the electronic device with sensing function can be improved.

In addition, it should be understood that the numbers of the second thin-film transistors and the sensing elements PD are not limited to those shown in the figures. According to different embodiments, there may be other suitable numbers of the second thin-film transistors and the sensing elements PD. Furthermore, the type of the second thin-film transistor may also include a top gate thin-film transistor, a bottom gate thin-film transistor, a dual gate (or double gate) thin-film transistor, or a combination thereof. In accordance with some embodiments, the second thin-film transistor may be further electrically connected with a capacitor element, but it is not limited thereto. Furthermore, the second thin-film transistor may include at least one semiconductor layer, a gate dielectric layer, and a gate electrode layer. The second thin-film transistors may exist in various forms known to those skilled in the art, and the detailed structure of the second thin-film transistors will not be repeated here.

In addition, the equivalent circuit diagram of the driving circuit 100C' and the sensing elements PD are further described as follows. As described above, the first thin-film transistor TR1 (or the first thin-film transistor TR2, or the first thin-film transistor TR3) can be electrically connected to the sensing element PD through the second thin-film transistor TRX1, and can be electrically connected to other sensing elements PD through the second thin-film transistor TRX2, the second thin-film transistor TRX3 and the second thin-film transistor TRX4, respectively.

Specifically, each sensing element PD has a first terminal and a second terminal, the first terminal is coupled to the system voltage line VCC2, and the second terminal is coupled to the first terminal of the second thin-film transistor TRX1, the second thin-film transistor TRX2, the second thin-film transistor TRX3 or the second thin-film transistor TRX4. In addition, the second terminals of the second thin-film transistor TRX1, the second thin-film transistor TRX2, the second thin-film transistor TRX3, and the second thin-film transistor TRX4 are coupled to the second terminal of the first thin-film transistor TR1 and the control terminal of the first thin-film transistor TR2.

The first thin-film transistor TR1 has a first terminal, a second terminal and a control terminal, the first terminal is coupled to the system voltage line VCC1, the second terminal is coupled to the sensing element PD, and the control terminal is coupled to the control signal RST. The first thin-film transistor TR1 can be connected to or disconnected from the system voltage line VCC1 according to the control signal RST. When the first thin-film transistor TR1 is connected to the system voltage line VCC1, the electrical potential of the sensing elements PD can be reset respectively; on the other hand, when the first thin-film transistor TR1 is disconnected from the system voltage line VCC1, the electrical potential of the sensing elements PD are not reset. Moreover, the first thin-film transistor TR1 can in turn reset the electrical potential of the sensing elements PD that are respectively connected to the second thin-film transistor TRX1, the second thin-film transistor TRX2, the second thin-film transistor TRX3 and the second thin-film transistor TRX4.

Furthermore, the first thin-film transistor TR2 also has a first terminal, a second terminal and a control terminal, the first terminal is coupled to the system voltage line VCC0, the second terminal is coupled to the first terminal of the first thin-film transistor TR3, and the control terminal is coupled to the second terminal of the first thin-film transistor TR1 and the second terminal of the sensing element PD.

Moreover, the first thin-film transistor TR3 also has a first terminal, a second terminal and a control terminal, the first terminal is coupled to the second terminal of the first thin-film transistor TR2, the second terminal is coupled to the readout signal line VOUT, and the control terminal is coupled to the scan line signal SEL. The first thin-film transistor TR3 can be connected to or disconnected from the first terminal of the first thin-film transistor TR3 and the readout signal line VOUT according to the scan line signal SEL. When the first terminal of the first thin-film transistor TR3 is connected to the readout signal line VOUT, the current can be output to the readout signal line VOUT; on the other hand, when the first terminal of the first thin-film transistor TR3 is disconnected from the readout signal line VOUT, no current is output to the readout signal line VOUT. In addition, the signals of the second thin-film transistor TRX1, the second thin-film transistor TRX2, the second thin-film transistor TRX3, and the second thin-film transistor TRX4 can be output to the readout signal line VOUT in turn.

Figure 6:
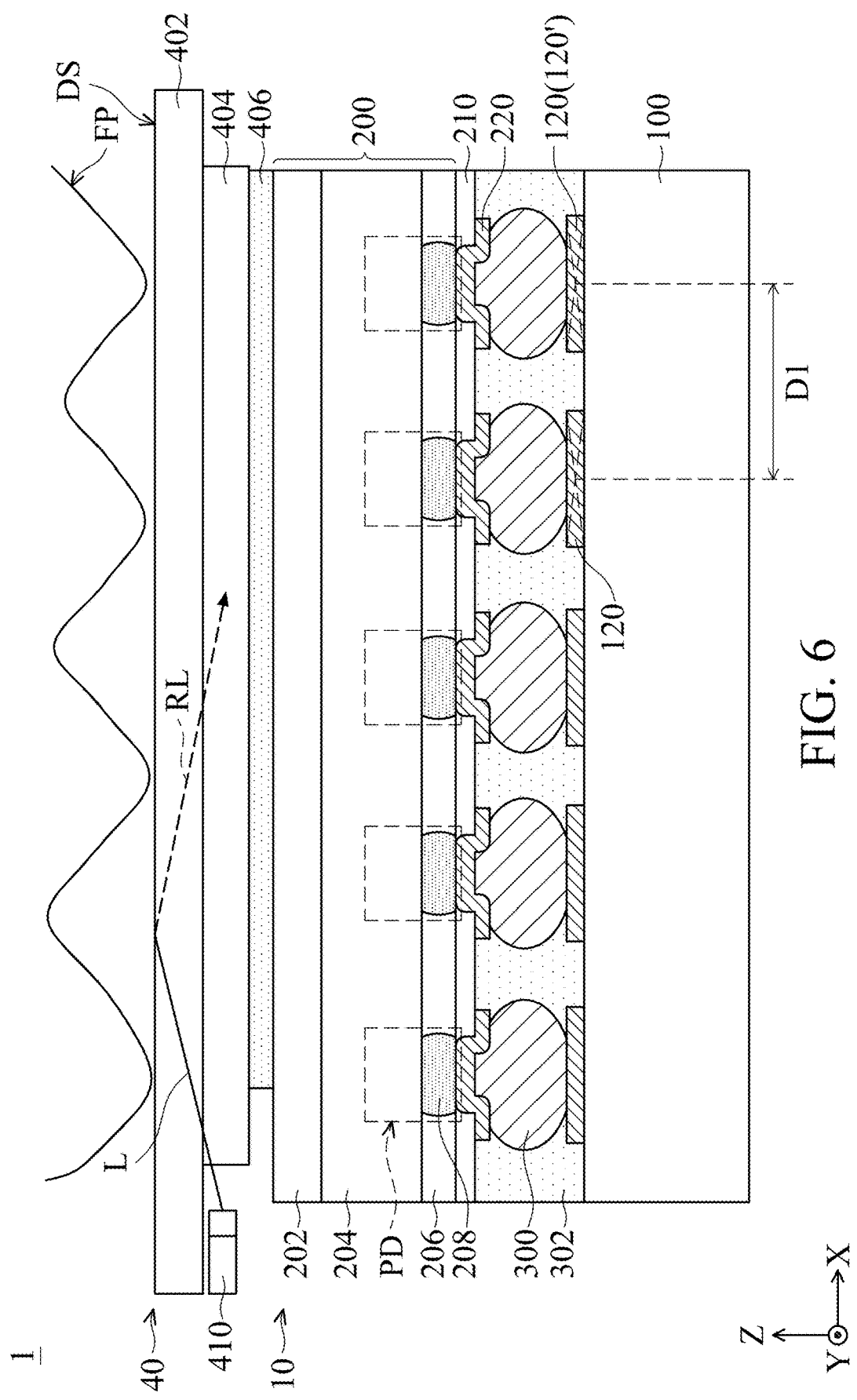
FIG. 6 is a cross-sectional diagram of an electronic device in accordance with some embodiments of the present disclosure.

Next, refer to FIG. 6, which is a cross-sectional diagram of an electronic device 1 in accordance with some embodiments of the present disclosure. It should be understood that, for clear description, only some elements of the electronic device 1 are schematically shown in the figure. In accordance with some embodiments, additional features may be added to the electronic device 1 described below.

In accordance with some embodiments, the electronic device 1 includes the aforementioned sensing device 10 and a display panel 40. The display panel 40 has a display side DS, and the sensing device 10 may be attached to a side of the display panel 40 opposite to the display side DS. In accordance with some embodiments, the electronic device 1 has a sensing function. Specifically, the electronic device 1 may have functions such as touch-sensing or fingerprint recognition. For example, the electronic device 1 may be a touch display device, but it is not limited thereto. For example, the light L generated by the display panel 40 is reflected by the finger FP to generate the reflected light RL, and the reflected light RL can be transmitted to the sensing device 10, and the sensing device 10 can sense the touch of the finger and convert it into an electronic signal to the corresponding driving element or signal processing element for identification and analysis.

Specifically, in accordance with some embodiments, the display panel 40 includes a cover plate 402, a display layer 404 and a light source 410, the cover plate 402 is disposed on the display layer 404, and the display layer 404 and the light source 410 are adjacent to the cover plate 402. In addition, the display layer 404 and the light source 410 do not overlap in a normal direction of the cover plate 402 (e.g., the Z direction shown in the drawing). The Z direction may be, for example, the normal direction of the cover plate 402, the X direction may be perpendicular to the Z direction, and the Y direction may be perpendicular to the Z direction.

In accordance with some embodiments, the cover plate 402 provides a surface for touch and operation, and protect structures such as the display layer 404 disposed under the cover plate 402. In accordance with some embodiments, the material of the cover plate 402 may include glass, quartz, sapphire, ceramic, another suitable material, or a combination thereof, but it is not limited thereto.

In accordance with some embodiments, the light source 410 provides light in the infrared wavelength range, and the sensing elements PD absorb the light emitted by the light source 410. In other words, the light source 410 is used to provide light (for example, light L shown in the figure) in a specific infrared wavelength range to the sensing elements PD. In accordance with some embodiments, the wavelength range of the aforementioned infrared light is greater than or equal to about 750 nm and less than or equal to about 1500 nm (i.e. 750 nm≤wavelength≤1500 nm). In accordance with some embodiments, the wavelength range of light provided by light source 410 is greater than the wavelength range of light provided by display layer 404. It should be noted that the sensing element PD that absorbs light in a specific wavelength range can reduce the noise generated by ambient light and the light generated by the display layer 404 being absorbed by the sensing elements PD, thereby improving the sensitivity or overall performance of the electronic device 1.

In addition, as shown in FIG. 6, in accordance with some embodiments, the electronic device 1 further includes an adhesive layer 406, and the adhesive layer 406 is disposed between the display panel 40 and the sensing device 10. The sensing device 10 may be attached to the side of the display panel 40 opposite to the display side DS through the adhesive layer 406, but it is not limited thereto. The adhesive layer 406 may include an adhesive material. In accordance with some embodiments, the adhesive layer 406 may include a light-curable adhesive material, a heat-curable adhesive material, a light-heat-curable adhesive material, another suitable material, or a combination thereof, but it is not limited thereto. For example, in accordance with some embodiments, the adhesive layer 406 may include optical clear adhesive (OCA), optical clear resin (OCR), pressure sensitive adhesive (PSA), another suitable material, or a combination thereof, but it is not limited thereto.

Figure 7:
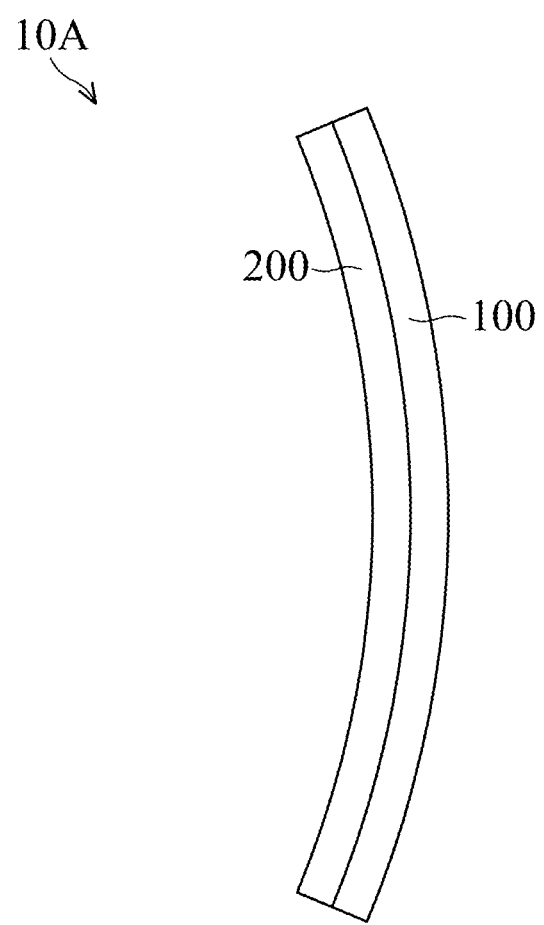
FIG. 7 is a structural diagram of a sensing device in accordance with some embodiments of the present disclosure.

Next, refer to FIG. 7, which is a structural diagram of a sensing device 10A in accordance with some embodiments of the present disclosure. It should be understood that FIG. 7 only schematically illustrates the driving substrate 100 and the sensing module 200 of the sensing device 10A. The sensing module 200 can be bonded to the driving substrate 100 through the bonding pads 300, but it is not limited thereto. For the detailed structures of the driving substrate 100 and the sensing module 200, reference may be made to the contents described in the foregoing embodiments, and thus will not be repeated here.

As shown in FIG. 7, in accordance with some embodiments, the first substrate 102 of the driving substrate 100 and the second substrate 202 of the sensing module 200 are curved substrates. That is, both the first substrate 102 of the driving substrate 100 and the second substrate 202 of the sensing module 200 are flexible. With such a structural design, the optical structures required for general sensing devices can be reduced or omitted. For example, the number of lenses required to be disposed can be reduced, but it is not limited thereto. Furthermore, the curved surface design can provide a wide field of view (FOV).

Figure 8:
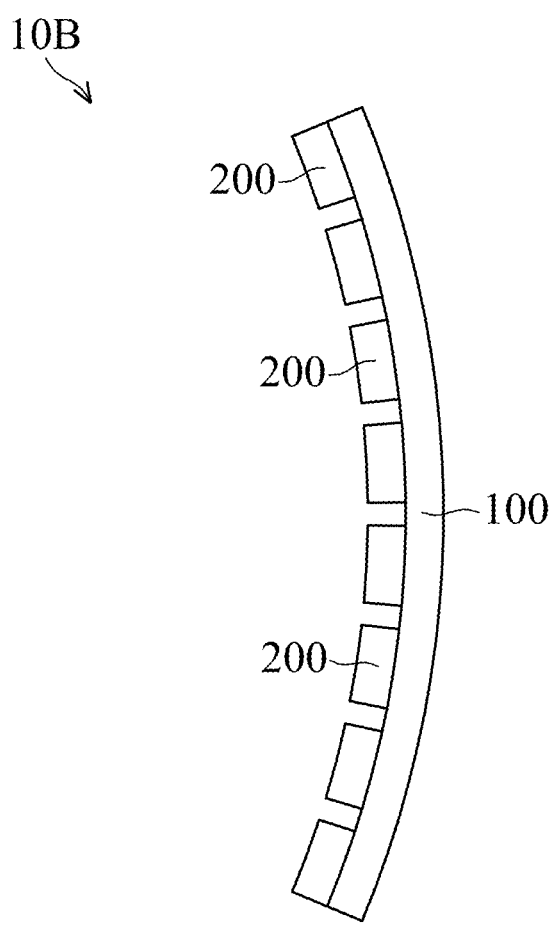
FIG. 8 is a structural diagram of a sensing device in accordance with some embodiments of the present disclosure.

Next, refer to FIG. 8, which is a structural diagram of a sensing device 10B in accordance with some other embodiments of the present disclosure. It should be understood that FIG. 8 only schematically illustrates the driving substrate 100 and the sensing module 200 of the sensing device 10B.

As shown in FIG. 8, in accordance with some embodiments, the sensing device 10B includes a plurality of sensing modules 200, and the sensing modules 200 are bonded to the same driving substrate 100. That is, the sensing modules 200 can be coupled to the same driving substrate 100. Specifically, a plurality of sensing modules 200 can be combined on the same driving substrate 100 through a plurality of bonding pads 300. Furthermore, the first substrate 102 of the driving substrate 100 and the second substrate 202 of the sensing module 200 can also be curved substrates. With such a structural design, the sensing modules 200 can be individually tested before being bonded to the driving substrate 100. If the sensing modules 200 are faulty, they can be replaced or repaired individually to improve the durability of the sensing device 10B.

To summarize the above, in accordance with some embodiments of the present disclosure, the provided sensing device uses an active matrix driving substrate including thin-film transistors. Through the substrate design of the disclosed embodiments, the manufacturing cost can be reduced, and the related application of the sensing device can be increased. In accordance with some embodiments of the present disclosure, the sensing device detects light in a specific wavelength range and combined with the structural design of the substrate to reduce the influence of noise on the sensing module, thereby improving the signal-to-noise ratio or enhancing the overall performance of the sensing device.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. A sensing device, comprising:
   a driving substrate, comprising a first substrate and a plurality of driving circuits disposed on the first substrate, each of the plurality of driving circuits comprising a plurality of thin-film transistors, wherein a material of the first substrate comprises glass or polyimide;
   a sensing module bonded to the driving substrate, the sensing module comprising a second substrate, a plurality of sensing elements and a passivation layer disposed on the second substrate, wherein the second substrate is an epitaxial substrate;
   a plurality of bonding pads, wherein the sensing module is bonded to the driving substrate through the plurality of bonding pads; and
   a plurality of first electrodes disposed on the driving substrate and a plurality of second electrodes disposed on the sensing module, wherein the plurality of bonding pads are disposed between the plurality of first electrodes and the plurality of second electrodes,
   wherein each of the plurality of driving circuits is electrically connected to at least one of the plurality of sensing elements,
   wherein the bonding pad has a first width, the first electrode has a second width, and the second electrode has a third width, and the first width is greater than or equal to the second width, and the first width is greater than or equal to the third width,
   wherein a pitch between the plurality of sensing elements is greater than or equal to 15 µm and less than or equal to 20 µm,
   wherein a wavelength of light penetrating the first substrate is greater than or equal to 4 µm and less than or equal to 10 µm,
   wherein the second electrode has a first portion disposed on a surface of the passivation layer and a second portion disposed in a through-hole of the passivation layer, and both the first portion and the second portion have a rounded corner.

2. The sensing device as claimed in claim 1, wherein the plurality of thin-film transistors comprise a first thin-film transistor and a plurality of second thin-film transistors, the first thin-film transistor is electrically connected to the plurality of sensing elements through the plurality of second thin-film transistors, respectively.

3. The sensing device as claimed in claim 2, wherein the plurality of second thin-film transistors are transfer transistors.

4. The sensing device as claimed in claim 1, wherein at least one of the plurality of sensing elements comprises a semiconductor material, and the semiconductor material comprises one of indium phosphide (InP), indium antimonide (InSb), indium gallium arsenide (InGaAs), lead sulfide (PbS), lead selenide (PbSe), mercury cadmium telluride (HgCdTe), or a combination thereof.

5. The sensing device as claimed in claim 1, wherein the first substrate and the second substrate are curved substrates.

6. The sensing device as claimed in claim 1, comprising a plurality of sensing modules, wherein the plurality of sensing modules are bonded to the driving substrate.

7. The sensing device as claimed in claim 1, wherein the plurality of sensing elements are used for absorbing light in an infrared wavelength range.

8. The sensing device as claimed in claim 7, wherein the infrared wavelength range is greater than or equal to 750 nm and less than or equal to 1500 nm.

9. An electronic device, comprising:
a display panel having a display side; and
a sensing device attached to a side of the display panel opposite to the display side, the sensing device comprising:
a driving substrate, comprising a first substrate and a plurality of driving circuits disposed on the first substrate, each of the plurality of driving circuits comprising a plurality of thin-film transistors, wherein a material of the first substrate comprises glass or polyimide;
a sensing module bonded to the driving substrate, the sensing module comprising a second substrate, a plurality of sensing elements and a passivation layer disposed on the second substrate, wherein the second substrate is an epitaxial substrate; and
a plurality of bonding pads, wherein the sensing module is bonded to the driving substrate through the plurality of bonding pads;
wherein each bonding pad of the plurality of bonding pads has a first width, the first electrode has a second width, and the second electrode has a third width, and the first width is greater than or equal to the second width, and the first width is greater than or equal to the third width,
wherein each of the plurality of driving circuits is electrically connected to at least one of the plurality of sensing elements,
wherein the plurality of sensing elements are closer to the display panel than the plurality of driving circuits,
wherein the display panel comprises a display layer and a light source, and the display layer and the light source do not overlap in a normal direction of the display layer,
wherein a wavelength of light penetrating the first substrate is greater than or equal to 4 μm and less than or equal to 10 μm,
wherein the second electrode has a first portion disposed on a surface of the passivation layer and a second portion disposed in a through-hole of the passivation layer, and both the first portion and the second portion have a rounded corner.

10. The electronic device as claimed in claim 9, wherein the light source provides light in an infrared wavelength range.

11. The electronic device as claimed in claim 10, wherein the infrared wavelength range is greater than or equal to 750 nm and less than or equal to 1500 nm.

12. The electronic device as claimed in claim 9, wherein the display panel further comprises a cover plate disposed on the display layer.

13. The electronic device as claimed in claim 9, further comprising an adhesive layer disposed between the display panel and the sensing device.

14. The electronic device as claimed in claim 9, wherein at least one of the plurality of sensing elements comprises a semiconductor material, and the semiconductor material comprises one of indium phosphide (InP), indium antimonide (InSb), indium gallium arsenide (InGaAs), lead sulfide (PbS), lead selenide (PbSe), mercury cadmium telluride (HgCdTe), or a combination thereof.

* * * * *